United States Patent [19]

Yamaguchi et al.

[11] Patent Number: 5,177,357
[45] Date of Patent: Jan. 5, 1993

[54] TRANSMISSIVE-TYPE PHOTO-INTERRUPTOR WITH MOLDED HOUSING AND CROSSTALK SHIELDING

[75] Inventors: Akifumi Yamaguchi, Yamatotakada; Shigenori Kitanishi, Tenri, both of Japan

[73] Assignee: Sharp Kabushiki Kaisha, Japan

[21] Appl. No.: 812,810

[22] Filed: Dec. 24, 1991

[30] Foreign Application Priority Data

Jan. 10, 1991 [JP] Japan ................................ 3-366[U]

[51] Int. Cl.$^5$ .............................................. G01D 5/34
[52] U.S. Cl. .................................. 250/231.16; 250/239
[58] Field of Search ................... 250/231.14, 231.16, 250/231.17, 231.18, 237 G, 239; 356/375

[56] References Cited

U.S. PATENT DOCUMENTS 3,814,934 6/1974 Mesh et al. .................... 250/231.16

Primary Examiner—David C. Nelms
Attorney, Agent, or Firm—Nixon & Vanderhye

[57] ABSTRACT

An apparatus for detecting the passing state of a passing object to be detected by using a two-phase output signal has at least two light receiving elements (12a, 12b) and at least two light emitting elements (13a, 13b) which are disposed in such a manner that one light receiving element confronts one light emitting element and the other light receiving element confronts the other light emitting element, in order that even when the thickness of the object of detection is larger than the slit width thereof, light can pass through the maximum of the slit width to maximize quantities of light incident upon the light receiving elements (12a, 12b). In addition, light shielding pieces (22, 23) are provided at the front surfaces of a light receiving side transparent resin block (14) and a light emitting side transparent resin block (15) to prevent cross talk between not-confronting light receiving and emitting elements (12a, 13b) as well as between not-confronting light receiving and emitting elements (12b, 13a).

7 Claims, 9 Drawing Sheets

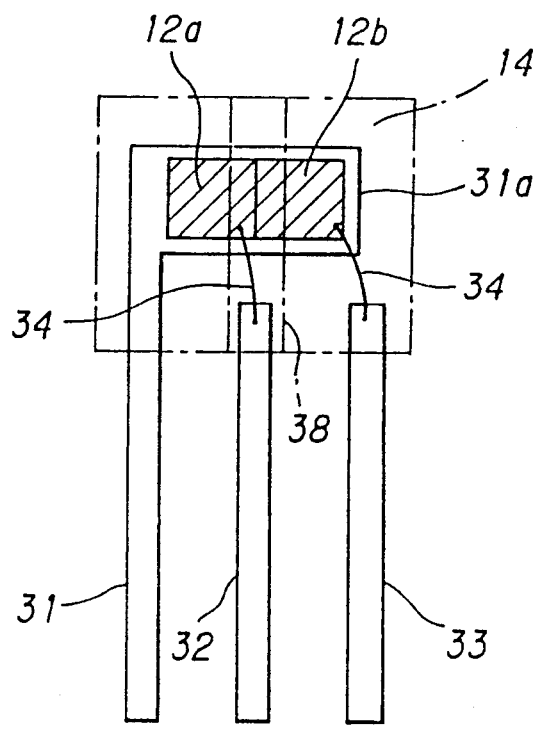
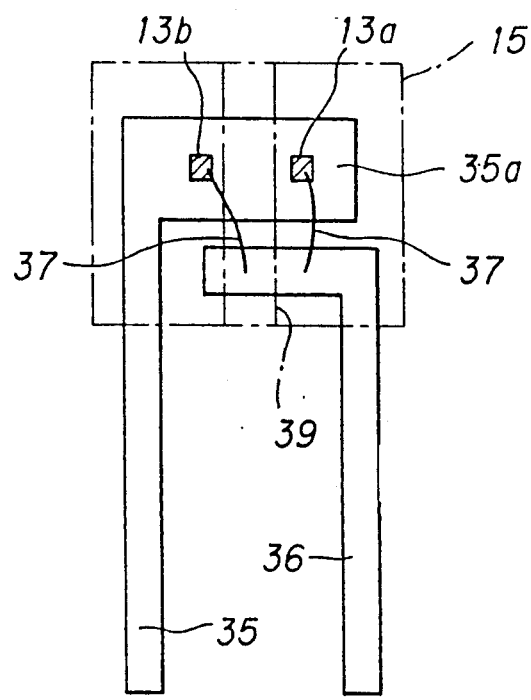

TRANSMISSIVE-TYPE PHOTO-INTERRUPTOR WITH MOLDED HOUSING AND CROSSTALK SHIELDING

BACKGROUND OF THE INVENTION

1. Field of the Invention

The present invention relates to an transmissivetype photo-interruptor for detecting the presence or absence and the moving direction and moving distance of an object to be detected which has slits, and more particularly to an trans-missivetype photo-interruptor free from cross talk which is utilized for detection of the moving direction and moving distance of, for example, a mouse adapted to control the cursor or the like on the display of information apparatus.

2. Description of the Prior Art

In a conventional trans-missivetype photo-interruptor utilized for detecting the moving direction and moving distance of the mouse adapted to control the cursor or the like on the display of information apparatus, a single light emitting element 1 bonded to one lead terminal 2a is connected to the other lead terminal 2b by a gold wire 3 and molded with transparent resin to form a light emitting side transparent resin block 4 (a primary mold) as shown in FIG. 3, two light receiving elements (photo detector element) 5a and 5b both bonded to one lead terminal 2c are respectively connected to the other two lead terminals 2d and 2e by gold wires 3 and molded with transparent resin to form a light receiving side transparent resin block 6 (a primary block) as shown in FIG. 4, the light emitting side transparent resin block 4 and the light receiving side transparent resin block 6 are disposed to oppose each other through a predetermined distance as shown in FIGS. 1 and 2, and these transparent resin blocks 4 and 6 are integrally molded with opaque resin excepting their light pass windows 4a and 6a to form an opaque resin sheath 8 (a secondary mold).

When utilizing the trans-missivetype photo-interruptor for the mouse, an object 7 to be detected having slits S which is rotated as the ball of the mouse rotates passes through a gap between the light emitting element 1 and the light receiving elements 5a and 5b as shown in FIGS. 5 and 6, so that mutually dephased output signals as shown in FIG. 7 can be produced from the light receiving elements 5a and 5b to permit detection of the moving direction and moving distance of the mouse.

As the object 7 of detection, a thin member made of metal has hitherto been used having a thickness T2 which is sufficiently smaller than a width W of the slit S as shown in FIG. 5 but recently, from the standpoint of weight reduction and cost reduction, a thick member made of resin has been used as the object 7 of detection, having a thickness T1 which is larger than the width W of the slit S as shown in FIG. 6.

When the thick object 7 of detection is detected with the aforementioned trans-missivetype photo-interruptor, because of the use of only one light emitting element 1, quantity $\phi 1$ of light incident upon the light receiving element 5a becomes less than quantity $\phi 2$ of incident light obtained for the thin object of detection (see FIGS. 5 and 6). Accordingly, with the object 7 of detection having the thickness larger than the width of slit S, an outputpeak value M as seen in FIG. 7 is lowered to decrease a ratio M/N and disadvantageously, only an output signal of a small S/N ratio is allowed to be delivered.

As further related art, there are mentioned, for example, Japanese Patent Laid-open No. Hei 1-40970, Japanese Utility Model Laid-open No. Hei 2-44358, Japanese Utility Model Laid-open No. Hei 2-101555 and Japanese Utility Model Laid-open No. Hei 2-114951.

SUMMARY OF THE INVENTION

The present invention contemplates elimination of the aforementioned disadvantages and it is an object of the invention to provide an trans-missivetype photo-interruptor capable of producing an output signal of a high S/N ratio even when the thickness of an object to be detected is larger than the slit width.

Another object of the invention is to provide an trans-missivetype photo-interruptor free from cross talk between light emitting and light receiving elements.

To accomplish the above objects, an transmissivetype photo-interruptor according to the invention comprises at least two light receiving elements molded with transparent resin to form a light receiving side transparent resin block, light emitting elements identical in number to the light receiving elements and molded with transparent resin to form a light emitting side transparent resin block, the two blocks being disposed to oppose each other suck that respective light receiving elements and respective light emitting elements are optically coupled with each other through a passage for an object to be detected which has slits and being integrally molded with opaque resin to form a resin sheath for housing the two blocks, and light shielding pieces, for prevention of cross talk between the light receiving and light emitting elements, formed at portions of opposing surfaces of the resin sheath excepting light pass windows at which the transparent resin blocks are partly exposed for light emission and light reception.

With the above construction, light emitted from each light emitting element passes through the light pass window on the side of light emitting element, the slit in an object of detection and the light pass window on the side of light receiving element and impinges upon each light receiving element to permit detection of the moving state of the object of detection.

In this procedure, light emitted from the respective light emitting elements can pass through the maximum of the slit width of the object to be detected because the respective light emitting elements confront the respective light receiving elements, thus increasing the quantity of light incident upon the respective light receiving elements.

The light shielding pieces are provided at the light emitting and light receiving side light pass windows and therefore, even when a slit in the object of detection is positioned near the center of the trans-missivetype photo-interruptor, light from the respective light emitting elements can be prevented from impinging upon the not-confronting light receiving elements.

Further, according to the invention, there is provided an trans-missivetype photo-interruptor in which a light shielding piece for prevention of cross talk is so formed as to extend to the inside of at least one of the light receiving side transparent resin block and light emitting side transparent resin block.

With this construction, the distance between the light emitting element or light receiving element and the front central portion of the light receiving or light emitting side transparent resin block can be reduced to prevent cross talk from occurring inside the transparent resin block.

BRIEF DESCRIPTION OF THE DRAWINGS

FIG. 10 is a diagram showing the state in which light receiving elements are carried on a lead terminal in the FIG. 8 apparatus;

FIG. 11 is a diagram showing the state in which light emitting elements are carried on a lead terminal in the FIG. 8 apparatus;

DESCRIPTION OF THE PREFERRED EMBODIMENTS

Preferred embodiments of the invention will now be described with reference to the accompanying draw-ings.

Figure 1:
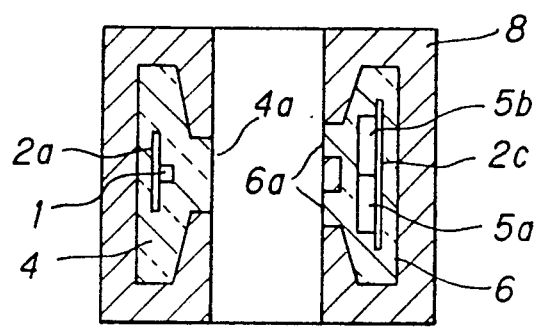
FIG. 1 is a sectional view showing a prior art trans-missivetype photo-interruptor.
Figure 2:
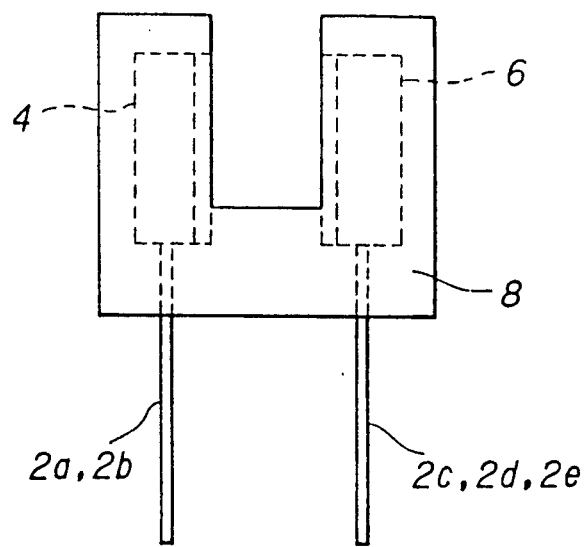
FIG. 2 is a side view of FIG. 1.
Figure 3:
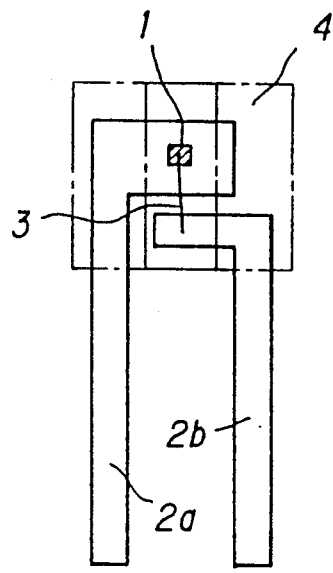
FIG. 3 is a diagram showing the state in which a light emitting element is carried on a lead terminal in the FIG. 1 apparatus.
Figure 4:
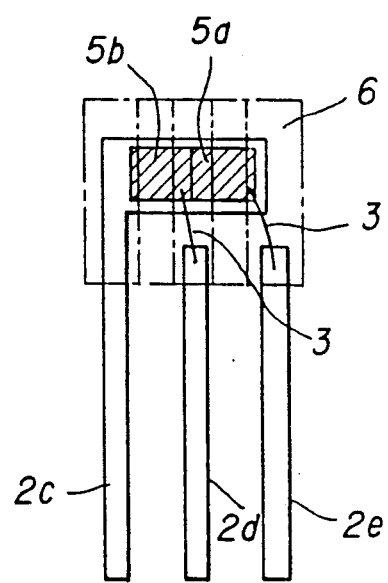
FIG. 4 is a diagram showing the state in which light receiving elements are carried on a lead terminal in the FIG. 1 apparatus.
Figure 5:
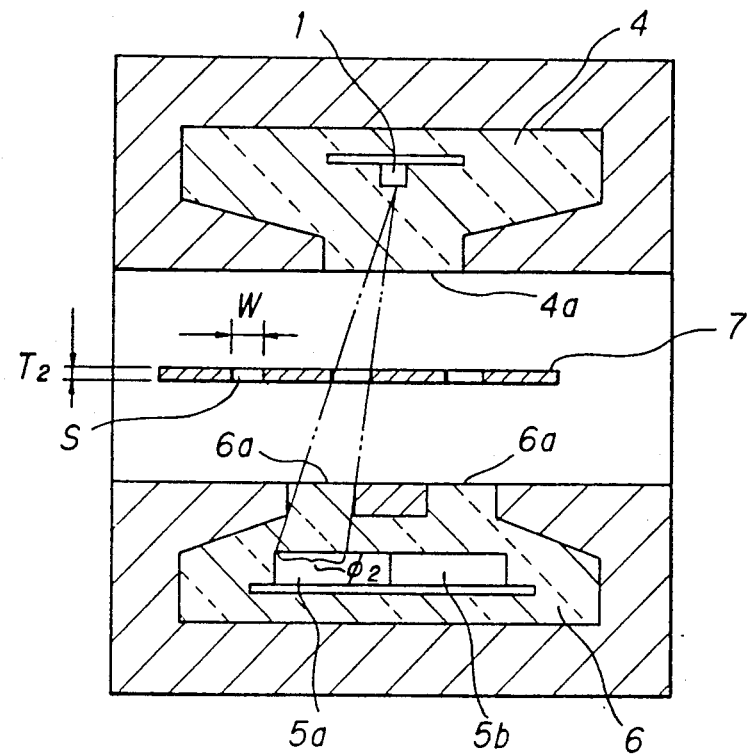
FIG. 5 is a diagram showing an optical path when detecting an object of detection having a thickness smaller than a slit width in the FIG. 1 apparatus.
Figure 6:
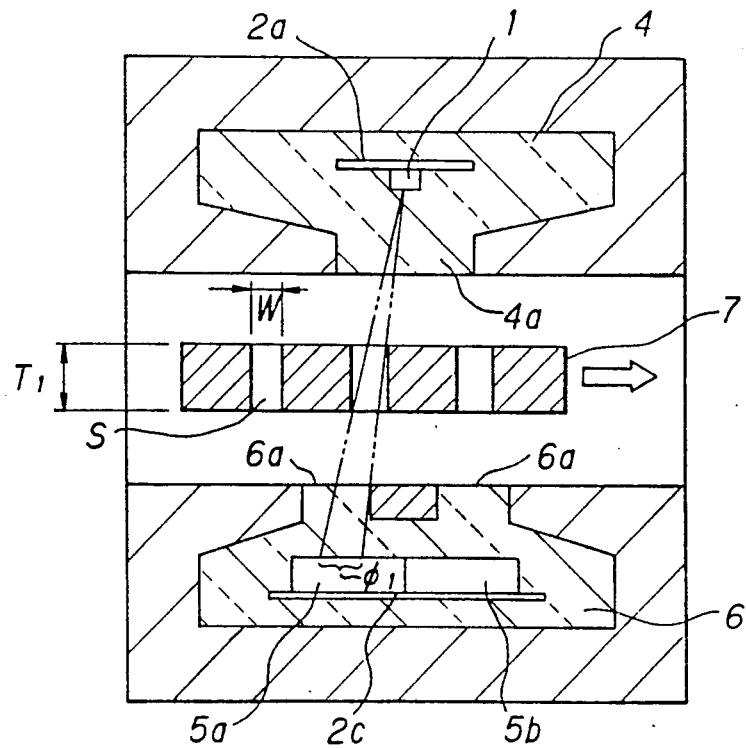
FIG. 6 is a diagram showing an optical path when detecting an object of detection having a thickness larger than a slit width in the FIG. 1 apparatus.
Figure 7:
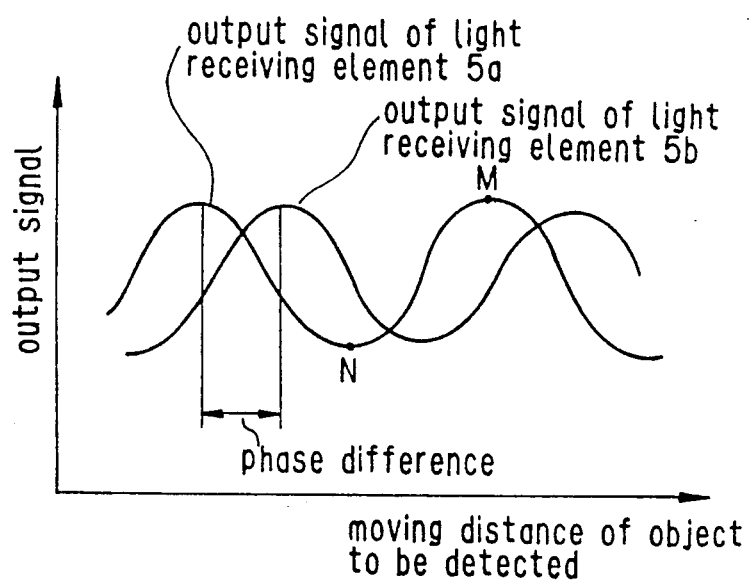
FIG. 7 is a graph showing the relation between the moving distance of object of detection and the output signal of trans-missivetype photo-interruptor.
Figure 8:
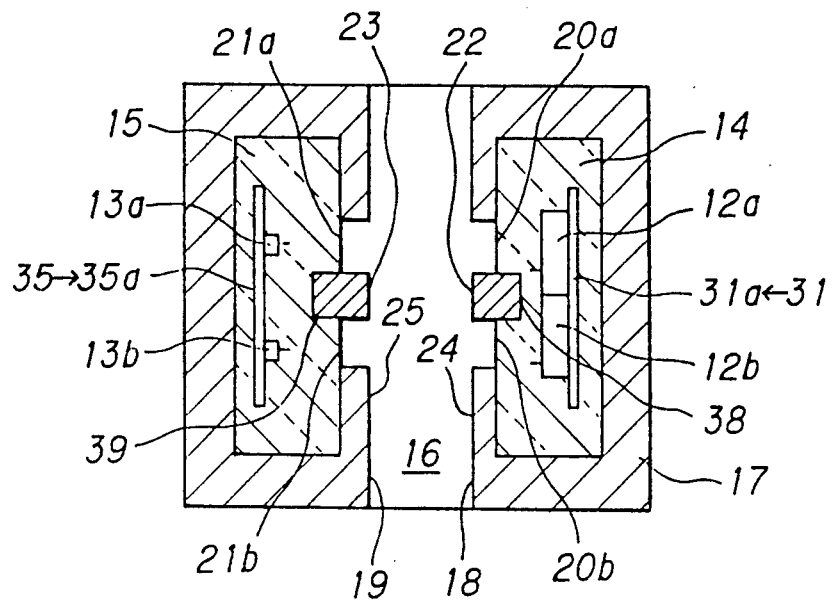
FIG. 8 is a sectional view showing an transmis-sivetype photo-interruptor according to a preferred embodiment of the invention.
Figure 12:
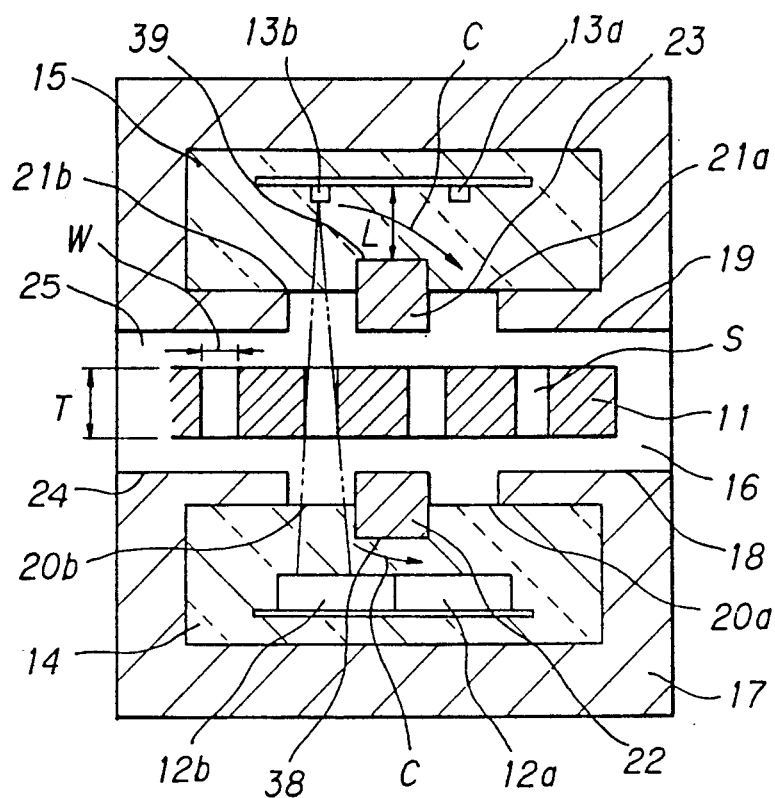
FIG. 12 is a diagram showing an optical path when a slit in an object of detection is positioned on a line con-necting a set of light receiving and light emitting ele-ments which confront each other in the FIG. 8 appara-tus.

Referring to FIGS. 8 and 12, there is illustrated a preferred embodiment of an trans-missivetype photo-interruptor (photo-interrupter)according to the inven-tion. The trans-missivetype photo-interruptor is adapted to detect, in contactless fashion, the presence or absence of an object 11 to be detected which has a number of slits S and it has a pair of light receiving elements 12a and 12b disposed side by side in a direction of movement of the object 11 of detection so as to pro-duce a two-phase output signal effective for detection of the moving direction and moving distance of the object 11 of detection, and a pair of light emitting ele-ments 13a and 13b confronting the light receiving ele-ments 12a and 12b, respectively.

The light receiving elements 12a and 12b are molded with transparent resin to form a light receiving side transparent resin block 14 and the light emitting ele-ments 13a and 13b are molded with transparent resin to form a light emitting side transparent resin block 15.

The light receiving side transparent resin block 14 and light emitting side transparent resin block 15 oppose each other so that the light emitting elements 13a and 13b may optically couple with the light receiving ele-ments 12a and 12b, respectively, through a passage 16 for the detection object 11.

The light receiving side transparent resin block 14 and light emitting side transparent resin block 15 are integrally molded with opaque resin so as to be housed in a resin sheath 17.

The resin sheath 17 has opposing surfaces 18 and 19 each formed with light pass windows 20a and 20b for exposing part of the transparent resin block 14 and light pass windows 21a and 21b for exposing part of the transparent resin block 15, to ensure that light emitted from the light emitting elements 13a and 13b can be incident on the light receiving elements 12a and 12b through these light pass windows 21a, 21b and 20a and 20b. A central light shielding piece 22 for prevention of cross talk is provided between the adjacent light pass windows 20a and 20b and distal light shielding pieces 24 are provided at opposite ends of the light pass windows 20a and 20b. Similarly, a central light shielding piece 23 for prevention of cross talk is provided between the adjacent light pass windows 21a and 21b and distal light shielding pieces 25 are provided at opposite ends of the light pass windows 21a and 21b.

It is herein meant by the term "cross talk" that trans-mission/reception of light is effected between the light emitting element 13a and light receiving element 12b which do not confront each other and/or between the light emitting element 13b and light receiving element 12a which do not confront each other.

The light receiving elements 12a and 12b (phototran-sistors) are formed in one chip so as to be adjacent with each other as shown in FIG. 8 and 10 with a view of producing a two-phase output signal. The light receiv-ing elements 12a and 12b are bonded to a carrier piece 31a of a light receiving side carrying lead terminal 31 through die bonding and they are respectively con-nected to light receiving side connecting lead terminals 32 and 33 by gold wires 34.

The light emitting elements 13a and 13b (infrared light emitting diodes) are bonded to a carrier piece 35a of a light emitting side carrying lead terminal 35 through die bonding and connected to a light emitting side connecting lead terminal 36 by gold wires 37 as shown in FIG. 11 so that they may respectively con-front the center positions of the light receiving elements 12a and 12b as shown is FIG. 8.

Each of the transparent resin blocks 14 and 15 is formed by molding through casting or transfer process using thermosetting transparent resin such as epoxy.

As shown in FIG. 8, 9, 12 and 13, the transparent resin blocks 14 and 15 are respectively formed at their front central portions with vertical recesses 38 and 39 which respectively receive the central light shielding pieces 22 and 23 for prevention of cross talk between the light receiving element 12a and light emitting ele-ment 13b and/or between the light receiving element 12b and light emitting element 13a.

Figure 9:
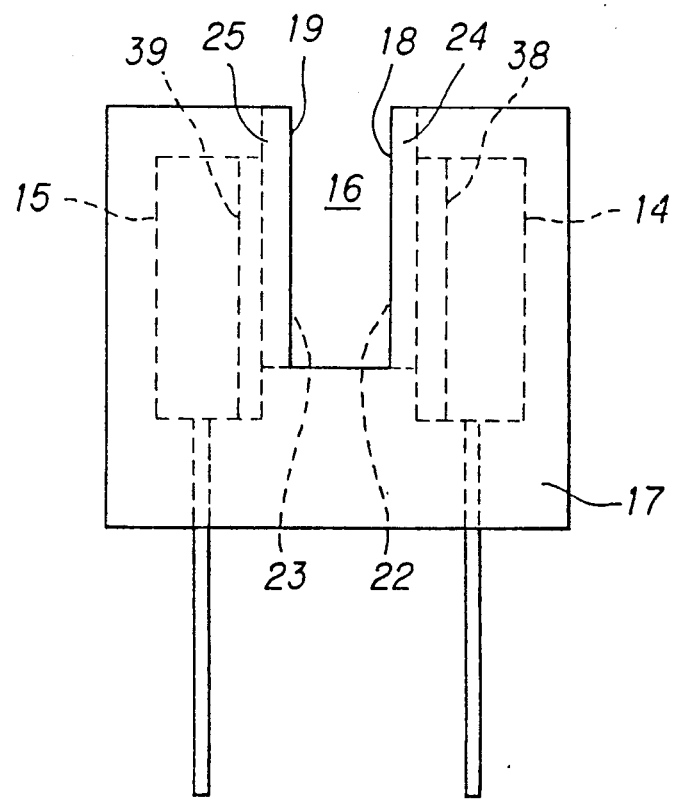
FIG. 9 is a side view of FIG. 8.

The resin sheath 17 is adapted to prevent intrusion of external disturbance light and to fix the transparent resin blocks 14 and 15 to permit them to be coupled optically with each other. The resin sheath 17 may be made of a thermoplastic transparent resin material such as polyphenylenesulfide (PPS) and has a recessed sideview form as shown in FIG. 9 to cover, for light shielding purpose, the overall peripheral surfaces of the transparent resin blocks 14 and 15 excepting the strip-like light pass windows 20a, 20b, 21a and 21b (see FIG. 8).

The central light shielding pieces 22 and 23 as well as the distal light shielding pieces 24 and 25 are molded integrally with the resin sheath 17 upon molding thereof such that as shown in FIG. 8, the central light shielding pieces 22 and 23 to be disposed in the middle of the opposing surfaces 18 and 19 are fitted in the recesses 38 and 39 respectively formed in the transparent resin blocks 14 and 15, so as to project inwards towards the passage 16 until they are flush with the opposing surfaces 18 and 19 of the resin sheath 17. In this manner, as shown in FIG. 12, the front to rear geometrical dimension of each of the central light shielding pieces 22 and 23 can be set satisfactorily to interrupt the optical path between the light emitting element 13a and light receiving element 12b which do not confront each other and that between the light emitting element 13b and light receiving element 12a which do not confront each other and to meet the prevention of cross talk between these not-confronting light emitting and light receiving elements. The distal light shielding pieces 24 and 25 each provided at the opposite ends of each of the opposing surfaces 18 and 19 are effective to prevent intrusion of external disturbance light.

In an alternative, the central light shielding pieces 22 and 23 as well as the distal light shielding pieces 24 and 25 may be formed separately from the resin sheath 17.

Operation of detecting an detection object 11 by using the trans-missivetype photo-interruptor constructed as above will now be described.

Firstly, the two light emitting elements 13a and 13b are activated to emit light. Then, the light receiving elements 12a and 12b receive light passing through the light pass windows 21a, 21b and 20a, 20b and the slits S in the detection object 11 to detect the presence or absence of the detection object 11 and the moving state thereof.

In this procedure, even when the detection object 11 has a thickness T which is larger than a width W of the slit S in the detection object 11 as shown in FIG. 12, light from the light emitting elements 13a and 13b can pass through the maximum of the width W of the slit S in the detection object 11 because the light emitting element 13a confronts the light receiving element 12a and the light emitting element 13b confronts the light receiving element 12b, thus making it possible to increase the quantities of light incident upon the light receiving elements 12a and 12b.

Further, thanks to the recesses 38 and 39 formed in the transparent resin blocks 14 and 15 on the center lines thereof as shown in FIG. 12, the distance, as represented by L, between the front central portion of the transparent resin block 15 and the paired light emitting elements 13a and 13b and that between the front central portion of the transparent resin block 14 and the paired light receiving elements 12a and 12b can be reduced to suppress the quantity of light passing through intersecting optical paths as represented by C, and consequently the probability that the light passing through the intersecting optical paths goes out of the light pass windows 21a and 21b, then passes through the light receiving side light pass windows 20a and 20b and finally impinges upon the not-confronting light receiving elements 12a and 12b to cause cross talk can be decreased to reduce noise.

Figure 13:
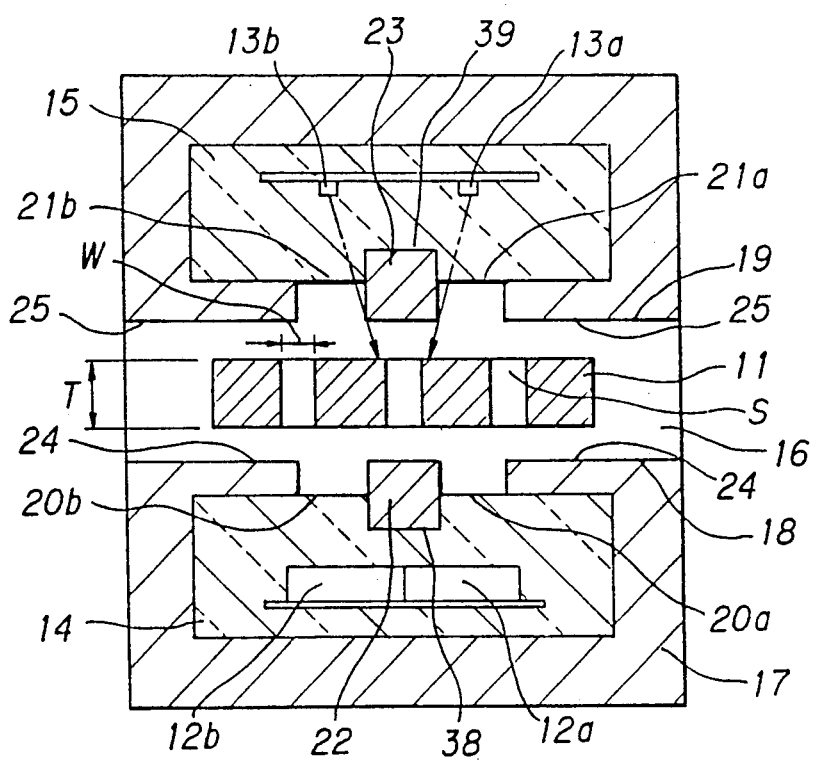
FIG. 13 is a diagram showing an optical path when a slit in the object of detection is positioned at the center of the trans-missivetype photo-interruptor in the FIG. 8 apparatus.
Figure 14:
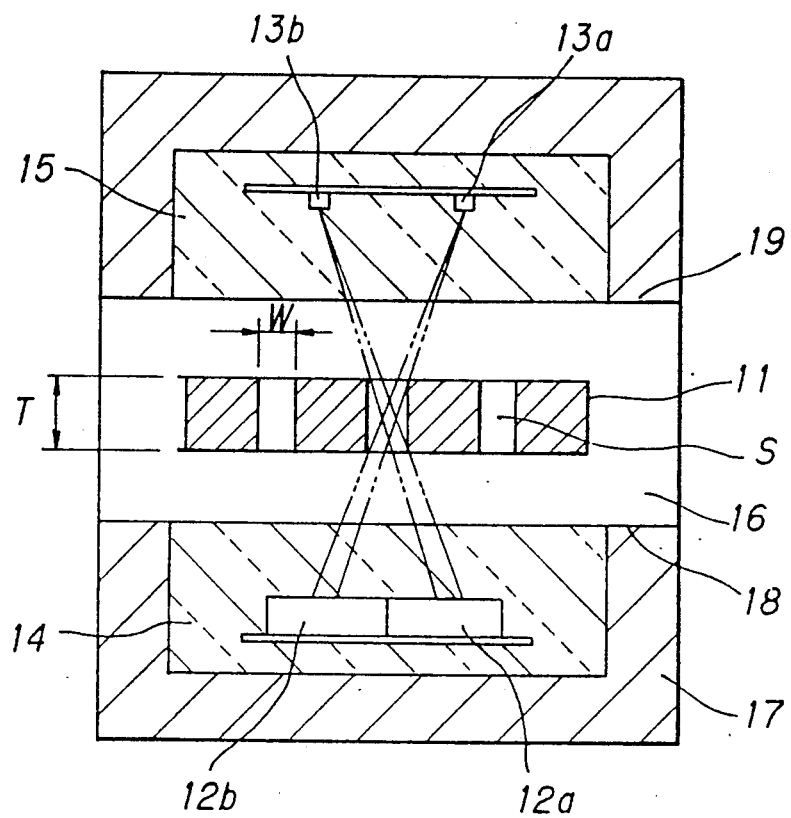
FIG. 14 is a diagram showing optical paths when the light shielding piece is not provided.

When a slit S in the detection object 11 is positioned near the center of the optical coupling apparatus as shown in FIG. 13, without the central light shielding pieces 22 and 23, light emitted from the light emitting elements 13a and 13b would impinge upon the not-confronting light receiving elements 12b and 12a to cause cross talk and consequently noise takes place which is prone to cause erroneous operations.

However, in the present preferred embodiment, by virtue of the central light shielding pieces 22 and 23 covering the front central portions of the transparent resin blocks 14 and 15 excepting the light pass windows 20a, 20b, 21a and 21b as shown in FIG. 13, light emitted from the light emitting elements 13a and 13b can be prevented from impinging upon the not-confronting light receiving elements 12b and 12a.

As described above, the trans-missivetype photo-interruptor of the present preferred embodiment can produce an output signal of a high S/N ratio even when the thickness of the detection object is larger than the slit width thereof and can therefore detect the moving direction and moving distance of the detection object while improving optical characteristics of the trans-missivetype photo-interruptor.

The present invention is not limited to the foregoing preferred embodiment and obviously the foregoing preferred embodiment can be modified and changed in many ways within the framework of the present invention.

Figure 15:
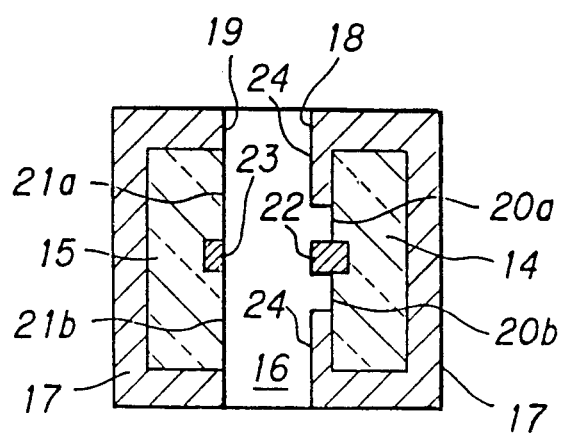
FIG. 15 is a sectional view showing another pre-ferred embodiment of the invention.

For example, as shown in FIG. 15, a central light shielding piece and distal light shielding pieces provided at the front surface of only one of the light emitting side and light receiving side transparent resin blocks 14 and 15 may project from the front surface toward the passage 16.

Figure 16:
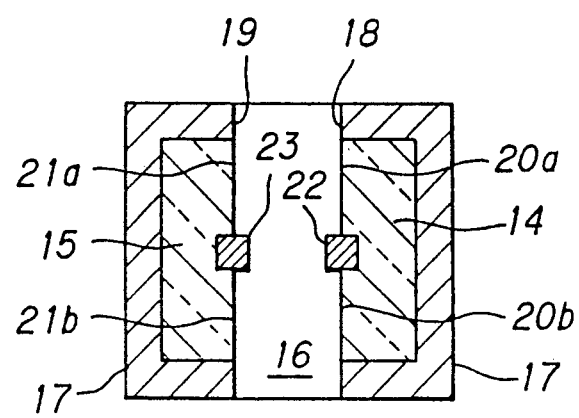
FIG. 16 is a sectional view showing still another preferred embodiment of the invention.

Also, as shown in FIG. 16, the distal light shielding pieces may be removed and only central light shielding pieces 22 and 23 may be provided. In this case, as in the case of FIG. 15, only one of the pieces may be provided for either the light emitting side or the light receiving side.

Figure 17:
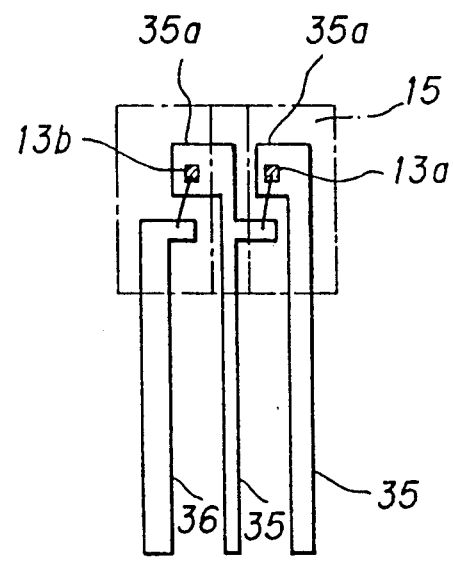
FIG. 17 is a diagram showing another preferred em-bodiment of the light emitting elements.

Further, as shown in FIG. 17, light emitting elements 13a and 13b may be connected in series.

Furthermore, in place of the two light receiving elements 12a and 12b formed in one chip, two ordinary photo-transistors each having one output may be used.

The foregoing preferred embodiment has been described as having one pair of light emitting elements and one pair of light receiving elements but two or more of pairs of light emitting elements and of light receiving elements may be provided.

What is claimed is:

1. An transmission-type photo-interruptor comprising:
   at least two light receiving elements molded with transparent resin to form a light receiving side transparent resin block;
   light emitting elements identical in number to said light receiving elements and molded with transparent resin to form a light emitting side transparent resin block, said two blocks being disposed to oppose each other such that respective light receiving elements and respective light emitting elements are optically coupled with each other through a passage for an object which has slits to be detected and being integrally molded with opaque resin to form a resin sheath for housing said two blocks; and light shielding piece means, for prevention of cross talk between the non-opposed light receiving and light emitting elements, formed at portions of opposing surfaces of said resin sheath excepting light pass windows at which said transparent resin blocks are partly, exposed for providing the optical coupling.

2. An transmissive-type photo-interruptor according to claim 1 wherein said light shielding piece means is formed integrally with or separately from said resin sheath.

3. An transmissive-type photo-interruptor according to claim 1 wherein said light shielding piece means has a central light shielding piece and distal light shielding pieces, and said central and distal light shielding pieces project from the front surface of at least one of said light receiving side transparent resin block and light emitting side transparent resin block.

4. An transmissive-type photo-interruptor according to claim 3 wherein only said central light shielding piece is so formed as to extend to the inside of at least one of said light receiving side transparent resin block and light emitting side transparent resin block and to project from the surface of said one block.

5. An transmissive-type photo-interruptor according to claim 1 wherein said transparent resin block is made of thermosetting transparent resin.

6. An transmissive-type photo-interruptor according to claim 1 wherein said resin sheath is made of thermoplastic opaque resin.

7. An transmissive-type photo-interruptor according to claim 1 which is suitable for detecting the moving direction and moving distance of the object to be detected which has a thickness larger than a slit width.

* * * * *